United States Patent [19]

Polata

[11] 3,818,583

[45] June 25, 1974

[54] METHOD FOR FABRICATING SEMICONDUCTOR STRUCTURE HAVING COMPLEMENTARY DEVICES

[75] Inventor: Bohumil Polata, Los Altos, Calif.

[73] Assignee: Signetics Corporation, Sunnyvale, Calif.

[22] Filed: Sept. 25, 1972

[21] Appl. No.: 291,679

Related U.S. Application Data

[60] Continuation-in-part of Ser. No. 53,179, July 8, 1970, abandoned, which is a division of Ser. No. 791,656, Jan. 16, 1969, abandoned.

[52] U.S. Cl. .......... 29/578, 29/580, 148/186

[51] Int. Cl. .......... B01j 17/00

[58] Field of Search .......... 29/576 IW, 580, 578; 148/186

[56] References Cited

UNITED STATES PATENTS

| | | | |
|---|---|---|---|
| 3,314,832 | 4/1967 | Raithel | 148/186 |
| 3,327,182 | 6/1967 | Kisinko | 29/576 IW |
| 3,393,349 | 7/1968 | Huffman | 29/576 IW |
| 3,412,296 | 11/1968 | Grebene | 29/576 IW |
| 3,453,498 | 7/1969 | Hubner | 29/576 IW |

OTHER PUBLICATIONS

Electronics – March 1967, pp. 93–96, "IC Isolation: Options Offered."

*Primary Examiner*—W. Tupman
*Attorney, Agent, or Firm*—Flehr, Hohbach, Test, Albritton & Herbert

[57] ABSTRACT

Method for fabricating a semiconductor structure having complementary devices in which islands of one conductivity are formed by a backside diffusion into a semiconductor body of opposite conductivity type to provide regions of first and second conductivities which are subsequently dielectrically isolated before the formation of the complementary devices therein.

8 Claims, 12 Drawing Figures

INVENTOR.
Bohumil Polata
BY Flehr, Hohbach, Test, Albritton & Herbert
Attorneys

METHOD FOR FABRICATING SEMICONDUCTOR STRUCTURE HAVING COMPLEMENTARY DEVICES

CROSS-REFERENCE TO RELATED APPLICATION

This application is a continuation-in-part of an U.S. Pat. application Ser. No. 53,179, filed July 8, 1970, which is a division of U.S. Pat. application Ser. No. 791,656, filed Jan. 16, 1969, of which is now abandoned.

BACKGROUND OF THE INVENTION

In many circuits, there is a need for complementary devices as, for example NPN and PNP type transistors. In integrated circuits, there has been a lack of a complementary technology which has greatly restricted freedom of design in integrated circuits. Many attempts have heretofore been made to fabricate complementary devices but, in general, these have failed or resulted in devices with low performance. There is, therefore, a need for a new and improved semiconductor structure and method which makes possible the fabrication of complementary circuits.

SUMMARY OF THE INVENTION AND OBJECTS

The semiconductor structure consists of a support body with at least two islands of semiconductor material having planar surfaces lying in a common plane and with one of the islands being of a first conductivity type and the other of the islands being of the second conductivity type. A layer of insulating material dielectrically isolates said islands from each other and from the support body. The first island serves as a first region of a first conductivity type and the second island serves as a second region of a second conductivity type. A third region of the second conductivity type is formed in said first region and provides a P-N junction which extends to the surface. A fourth region of the first conductivity type is formed in the second region and provides a P-N junction which extends to the surface. A fifth region of the first conductivity type is formed in the third region and provides a P-N junction which extends to the surface. A sixth region of the second conductivity type is formed in the fourth region and provides a P-N junction which also extends to the surface. The first, third and fifth regions form a transistor of one type and the second, fourth and sixth regions form a transistor of the opposite type. A layer of insulating material is provided on the surfaces of the islands and contact elements extend through the insulating material and make contact with said regions.

In a method for making complementary devices, a semiconductor body of a first conductivity type and having a major planar surface is utilized. A region of a second conductivity type is formed in the semiconductor body and extends inwardly from the surface. Isolation moats are then formed in the body and extend inwardly from the surface so that said isolation moats separate said regions of second conductivity type from the other portions of the semiconductor body. A layer of insulating material is formed on the surface and in the moats, and thereafter a support body is mounted on the layer of insulating material. Semiconductor material is then removed until the layer of insulating material in said moats extends through a surface so that the islands which are formed are dielectrically insulated from each other by the layer of insulating material and in which the islands are of first and second conductivity types. Complementary devices are then formed utilizing the islands of different conductivity types.

In general, it is an object of the present invention to provide a semiconductor structure and method which makes it possible to have complementary devices formed in a unitary structure.

Another object of the invention is to provide a semiconductor structure and method of the above character in which the complementary devices can be formed in integrated circuits.

Another object of the invention is to provide a semiconductor structure and method in which the complementary devices have excellent performance characteristics.

Another object of the invention is to provide a semiconductor structure and method of the above character in which the steps for forming the complementary devices can be carried out at the same time that the other devices in the integrated circuit are being formed.

Another object of the invention is to provide a semiconductor structure and method of the above character which makes possible the formation of high performance NPN double diffused transistors and high performance PNP triple diffused transistors within the same starting semiconductor body.

Another object of the invention is to provide a method of the above character in which the process utilized for the formation of one of the complementary devices does not unduly affect the formation of the other complementary device.

Additional objects and features of the invention will apear from the following description in which the preferred embodiment is set forth in detail in conjunction with the accompanying drawings.

BRIEF DESCRIPTION OF THE DRAWINGS

FIG. 11 is a graph relating bias voltage, concentration and depletion layer with reference to breakdown voltage.

FIG. 12 is a graph showing $LV_{CEO}$ and $BV_{CBO}$ curves as identified therein for various voltages and impurity concentrations.

DESCRIPTION OF THE PREFERRED EMBODIMENTS

Figures 1, 2, 3, 4, 5, 6, 7, 8, 9, 10:
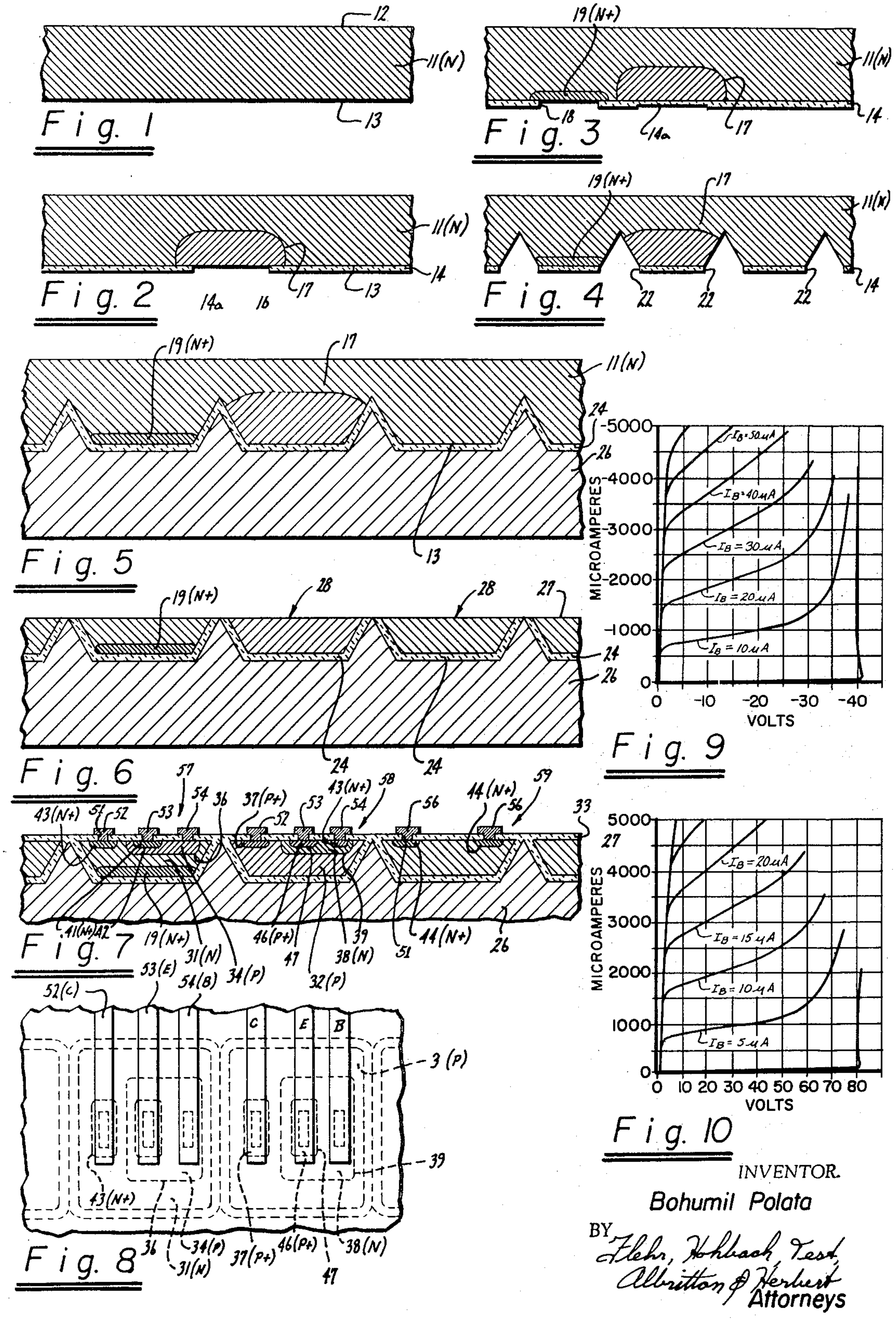
FIGS. 1–7 are cross-sectional views showing the method utilized for fabricating a semiconductor structure having complementary devices therein.
FIG. 8 is a plan view of a portion of the completed circuit shown in FIG. 7.
FIGS. 9 and 10 are graphs showing the performance characteristics of PNP and NPN complementary devices respectively.

In fabricating the semiconductor structure with complementary devices, a semiconductor body or wafer 11 is taken which is formed of a suitable material such as monocrystalline or single crystal silicon. The body or wafer 11 can be doped or undoped. If it is undoped, it is necessary to diffuse an impurity of a first conductivity type into at least a portion of the body. Preferably, it is desirable to obtain a body or wafer 11 having an impurity of the first conductivity diffused therein. Thus, as shown in FIG. 1, the body can have an N-type impurity therein.

The body or wafer 11 is lapped and polished to provide two planar parallel surfaces 12 and 13. A layer 14 of insulating material is formed at least on the surface 13 by placing the semiconductor body 11 in an oxidizing atmosphere. When the semiconductor body is formed of silicon, the layer 14 will be formed of silicon dioxide which is an insulating layer. Windows 16 are then formed in the layer 14 in appropriate places as, for example, on the back side or surface 13 where it is desired to form PNP type devices in the body or wafer. The N-type material which is exposed through the window 16 is converted to a P-type material by diffusing a P-type impurity through the window 16 to a considerable depth to provide a P-type region 17. By way of example, the P-type impurity can be boron and the impurity can be diffused to a suitable depth in the semiconductor body 11 as, for example, to a depth of 60 microns. Typically, such a diffusion step can be carried out in approximately 60 hours at a temperature of 1,295° C. to provide the P-type region 17. However, it should be appreciated that a diffusion step of this type can be carried out in a temperature range from between approximately 1,200° C. to approximately 1,300° C. The depth can range from approximately 15 microns to 80 microns. The time for carrying out such a diffusion can range from a minimum of approximately 8 hours to approximately 100 hours. Although such a diffusion step is relatively slow and time consuming, such a diffusion step is very simple and is completed before any other work is done on the wafer. The long exposure of the semiconductor body to a high temperature does not affect the other properties of the semiconductor body. Thus, the P-type diffusion is the first basic step in the formation of the complementary devices.

Because of the long diffusion, there is a growth of a silicon dioxide layer **14*a* of substantial thickness within the window 16. Because of this fact, it is unnecessary to strip the oxide layer 14. If it is desired to provide a buried layer in the NPN devices, additional windows 18 are opened in the insulating layer 14 and a heavily doped N+ region 19 is formed which extends inwardly for a slight distance from the surface 13 exposed through the windows 18**. Typically, arsenic or antimony can be utilized for this diffusion step.

After the N+ diffusion step has been carried out, the silicon dioxide layer 14 can be stripped and another oxide layer 14 regrown on the surface 13. Windows 22 are then formed in the silicon dioxide layer 14 by suitable photolithographic techniques to expose the surface 13 of the semiconductor body 11.

A suitable etch which, by way of example, can be an anisotropic etch, is utilized for forming moats 23 extending inwardly from the surface 13 into the semiconductor body 11. As can be seen, when an anisotropic etch is used, the moats are "V" shaped in cross-section with the apexes of the V's terminating at a common elevation within the semiconductor body. The moats 23 are positioned so that the P-type regions 17 are confined or cimcumscribed within single moats and the N+ regions 19 are also confined or circumscribed in single moats as shown in FIG. 4.

After the moats 23 have been formed, the entire surface 13 as well as the side walls of the moats 23 are covered with an insulating layer 24 formed of silicon dioxide by exposing the structure shown in FIG. 4 to an oxidizing atmosphere. If desired, the oxide layer 21 which remains on the semiconductor structure shown in FIG. 4 can be left in place or it can be stripped before forming the layer 24. A support body 26 is then formed on the insulating layer 24. Typically, the support body can take the form of polycrystalline silicon which is deposited upon the insulating layer 24 in a manner well known to those skilled in the art.

Thereafter, a substantial portion of the semiconductor body or wafer 11 is removed in a suitable manner which as by lapping and polishing until a planar surface 27 is formed through which the layer 24 disposed in the moats 23 extends so that there are provided a plurality of islands 28 which are dielectrically isolated from each other and from the support body by the insulating layer 24. As can be seen, the insulating layer 24 extends upwardly between the islands so that only the upper surfaces of the islands are exposed which are all common to the surface 27. As can be seen, certain of the islands 28 are formed of a semiconductor material having a first type of conductivity, namely, an N-type conductivity, whereas other of the islands 28 are formed with a semiconductor material of a P-type impurity. Also, certain of the islands have N= buried layers in the bottom portions thereof. The thickness of the islands is such that the islands can form first collector regions 31 of a first conductivity type and second collector regions 32 of a second conductivity type.

Thereafter, the fabrication of complementary devices in the islands 28 can be accomplished by either of two methods depending upon whether it is desired to optimize the NPN devices or to optimize the PNP devices. With either step, an oxide layer 33 is first grown on the surface 27. Thereafter, if it is assumed that it is desired to optimize the PNP devices, windows (not shown) are formed in the oxide layer 33 and a P-type impurity is diffused therethrough to form the third region 34 within the first region 31 to provide a P-N junction 36 which extends to the surface. The third region serves as a base for the NPN transistor. Thereafter, additional windows (not shown) are cut into the oxide layer 33 and P+ regions 37 are formed by diffusing a P-type impurity through the window. It should be pointed out that during each of the diffusion steps that the oxide regrows in the windows which have been formed and that normally it is unnecessary to strip the oxide and to place a new oxide coating on the surface 27 because the oxide which is formed in the windows is sufficiently thick. However, if desired, it should be appreciated that the entire oxide coating 33 can be stripped at any time and regrown to provide a new clean oxide if that is desired.

After the base NPN transistors have been completed, the bases for the PNP transistors are formed by providing windows in the oxide layer 33 in the appropriate places and diffusing an N-type impurity therethrough to provide a fourth region 38 of the first conductivity type within the second collector region and providing a P-N junction 39 which extends to the surface 27. A fifth region 41 of a first conductivity type is formed within the third region 34 by opening windows in the oxide layer 33 and diffusing an N-type impurity therethrough to provide a P-N junction 42 which extends through the surface 27. The fifth region serves as the emitter of the PNP transistor. At the same time that the fifth region is being formed, contact regions 43 are also being formed through windows (not shown) cut into the oxide layer 33. Thus, there is provided such a contact region for the collector region 31 of the NPN transistor. Similarly, there is also provided such a region for the base of the PNP transistor. Similarly, N+ contact regions 44 are provided in another island which is to be utilized as a bulk resistor. A sixth region 46 is formed by diffusing an impurity of the second conductivity type, i.e., P-type, which is provided in the oxide 33 and to the region 38 to provide a dish-shaped junction which extends to the surface 27.

When it is desired to optimize the NPN devices, the procedural steps hereinbeofre set forth are changed. Thus, the N-type region 38 in the PNP device is grown first to provide the base for the PNP device. Thereafter, the P-type region 34 to provide the base for the NPN transistor is diffused. The emitter region 46 for the PNP transistor is then diffused. At the same time, the P± contact region for the collector of the PNP device is diffused at the same time. Thereafter, the N+ emitter region 41 for the NPN device is diffused. At the same time, the contact regions 43 for the collector of the NPN device and the base of the PNP device are formed. At the same time, the contact regions 44 for the bulk resistor can be formed.

In optimizing the transistors in accordance with the present invention, the base width is trimmed to provide the desired characteristics. By this it is meant that the wafer is again heated in the diffusion furnace for a short period of time to obtain the desired base width by diffusing the emitter to a greater depth. In order to minimize the effect upon the NPN device, it is desirable in the formation of the PNP device that the base of the PNP device be shallower than the NPN base. As is well known to those skilled in the art, the deeper the diffusion, the less it will be affected by a short diffusion time.

When it is desired to optimize the design of the NPN device, a deeper PNP structure is utilized, i.e., the diffusion of the PNP base is at a greater depth so that the base width of the PNP device will not change appreciably.

As soon as the diffusion steps for the semiconductor structure have been completed, windows 51 are formed in the silicon dioxide layer by suitable photolithographic techniques. Thereafter, metallization of a suitable type such as aluminum is deposited on the insulating layer 33 and the undesired portions are removed by a suitable etch to provide a lead structure which includes contact elements 52, 53 and 54 which make contact to the collector, emitter and base regions, respectively, of the NPN transistors 57 and the PNP transistors 58. Additional contact elements 56 are formed for making contact to the bulk resistor 59. As shown in FIG. 7, the island which it utilized for making the bulk resistor can either have an N or P-type conductivity. By utilization of islands of P-type conductivity, it is possible to provide additional values of sheet resistivity for the resistors. The sheet resistivity which can be obtained is associated with the additional diffusions which are utilized to form the collector, base and emitter regions of the PNP transistor in addition to those conventionally associated with the formation of the collector, base and emitter of the NPN transistor.

As should be appreciated, the diffusion steps hereinbefore described can be utilized for forming other types of active and passive devices. For example, the same diffusion steps can be utilized for forming diodes and diffused resistors and capacitors. Similarly, the lead structure hereinbefore provided can be utilized for forming certain interconnections between the devices carried by the same support body and can terminate in contact pads (not shown) through which connections can be made to the outside world.

From the foregoing, it can be seen that the use of backside diffusion of an impurity of a second type, i.e., P-type, for the conversion of selected parts of the substrate or body containing an impurity of the first type, i.e., N-type, into islands of the second conductivity type makes it possible to fabricate conventional high performance NPN double diffused transistors and high performance triple diffused PNP transistors within the same starting substrate. The backside diffusion of the P-type impurity for the collector of the PNP transistors results in a collector structure in which the concentraion of the P-type impurity in the collector of the PNP transistors results in a collector structure in which the concentration of the P-type impurity in the collector region increases with depth in the collector region and in a direction away from the collector base junction. It is advantageous for a number of reasons. For example, this characteristic increases the breakdown voltage of the PNP transistor because the maximum electric field is located in the less highly-doped region of the collector near the metallurgical collector base junction or, in other words, in the region having the highest resistivity. This characteristic also provides a low saturation resistance because the current flows through the more highly doped portion of the collector region and thus in effect forms in the same way as the N+ buried layer in an NPN device. This characteristic also makes possible a thinner PNP device because the collector can be thinner for the same breakdown voltage. This is true because the depletion layer does not extend downwardly as far into the collector region in which the impurity concentration increases with depth as would be the case with a uniformly doped collector region. A higher frequency response is also possible because the incremental capacitance of the collector base junction is smaller than for that of the uniformly doped collector region.

The advantages of the back diffused collector region for the PNP devices becomes more significant when it is appreciated that at the present time it is not possible to provide a P-type buried layer in a PNP device to compare with the N+ buried layer in an NPN type device.

Also, from the foregoing, it can be seen that it is possible to fabricate the PNP type devices which are compatible with the NPN process which is widely used in the formation of integrated circuits and in particular linear integrated circuits. In addition, it can be seen that is is possible to fabricate NPN type devices which are compatible with the PNP process. In each of the foregoing methods, it can be seen that the P-type regions are formed prior to the formation of the grooves or moats which are utilized for dielectric isolation and before any N+ buried layers are provided. It is for this reason that even though a long diffusion at high temperature is required for the backside diffusion for the P-type regions, no harm is done to the semiconductor body or wafer which is to be utilized for the fabrication of the complementary circuits.

The curves for complementary devices constructed in accordance with the present invention optimizing the NPN devices are shown in FIGS. 9 and 10 with FIG.

9 being the curve for the PNP type device and the curve in FIG. 10 being for the NPN type device. Both curves were obtained by utilization of a conventional curve tracer.

Utilizing information from these graphs, it is found that the $h_{fe}$ for the PNP device is approximately 100 which is the forward current gain in the common emitter configuration. The $LV_{CEO}$ is approximately 42 volts with a relatively sharp breakdown characteristic as can be seen from the curves in FIG. 9.

For the PNP device, by the same calculations, it is found that the $h_{fe}$ is approximately 200. The $LV_{CEO}$ is approximately 80 volts.

The curves shown in FIGS. 9 and 10 and the calculations show that both the NPN and PNP devices which are obtained by this process are excellent devices. In particular, the characteristics of the PNP device are far superior to that which it has been possible to previously obtain in a triple diffused structure. It was found that the PNP device also had a very good frequency response. By way of example, it was found that it had a frequency response of 110 to 120 MHZ at 5 milliamperes. In addition, it has a low saturation voltage. From the curves, it can be seen that the saturation voltage is approximately 150 millivolts for 2 milliamperes which is unusually good for a triple diffused structure. Also, it can be seen that even though an excellent PNP type device has been provided, the characteristics of the NPN device have not been compromised. The characteristics of the NPN device are as good as those which can be obtained in any conventional integrated circuit. This is because the steps for forming the NPN and PNP devices are carried out in parallel.

In FIG. 11, there is shown a graph in which the impurity concentration of atoms per cm.[3] is shown on the abscissa, whereas the biasing voltage is shown on the ordinate. The abscissa also shows the resistivity for N-type silicon and P-type silicon and it could be seen that the N-type silicon has a lower resistivity than P-type for the same impurity concentration. In FIG. 11, there are two curves which show the maximum avalanche voltage breakdown for two junction curvatures, $X_j = 0$ and $X_j = 10$ microns. The maximum avalanche voltage breakdown is limited for each impurity concentration. To sustain any impressed voltage across a P-N junction, a depletion layer must be formed. The depth of the depletion layer will vary as a function of concentration and as a function of impressed voltage. As can be seen from FIG. 11, the depletion layer has been indicated for depths of 10 microns, 15 microns, 20 microns, etc. as a function of corresponding bias voltage and impurity concentration.

Let it be assumed that 100 volts is being impressed across the junction. If the substrate is 4 ohm cm. N-type material (which corresponds to a concentration of approximately $1.2 \times 10^{15}$), the depletion layer will have a thickness of approximately 10 microns. If the substrate is of higher resistivity, that is lower concentration as, for example, 10 ohm cm. N-type, the depletion layer will have a thickenss of 15 microns. With 2.5 ohm cm. N-type material, it would not be possible to obtain 250 volts breakdown as it falls above maximum avalanche breakdown voltage. Thus, it can be seen that a depletion layer must exist in order to sustain any voltage. For a higher voltage rating, the concentration has to be selected so that the maximum working voltage ($LV_{CEO}$) at which devices are to be used is significantly below the maximum avalanche breakdown voltage. Also, it should be noted that the backside diffusion which will form the collector at the complementary devices must be such that it will accommodate the depletion layer. In other words, the backside diffusion must be deeper than the depletion layer itself.

In FIG. 12, there is shown a graph which establishes that N-type material should be utilized as the starting material rather than P-type material. The arrangement is as follows. With the help of the physics of semiconductors, it can be shown that the ratio of $LV_{CEO}$ to avalanche breakdown for devices with the same current gain is smaller for NPN than for PNP devices. Thus, $LV_{CEO}/AV \cdot BKd \mid_{NPN} < LV_{CEO}/AV \cdot BKd \mid_{PNP}$. The $LV_{CEO}$ represents the highest working voltage that a transistor can sustain in any circuit in a common emitter configuration. As can be seen from FIG. 12, there is a greater drop in this maximum working voltage from the maximum breakdown voltage in NPN transistors than in PNP transistors for indicated current gain. Thus, in order to obtain two complementary transistors having the same working voltage rating, it is necessary to choose a material which has a higher maximum breakdown voltage for NPN devices so that the $LV_{CEO}$ voltage for both the NPN and PNP devices will be substantially the same and to obtain the required current gain set by circuit design criteria. Therefore, N-type starting material must be used, and not vice versa. This is true because if P-type starting material is utilized and compensated into N-type islands, the PNP type device would have a lower breakdown voltage and thus a much lower $LV_{CEO}$ so that the maximum working voltage for the two deivces would be substantially different. Complementary devices of this type would be substantially unusable.

For complementary transistors, the voltage ratings for the two transistors should be approximately the same as set forth in equation (1) below:

$$LV_{CEO} \mid_{NPN} \cong LV_{CEO} \mid_{PNP} \tag{1}$$

Equation (2) set forth below shows the relationship between $LV_{CEO}$ and $BV_{CBO}$:

$$LV_{CEO}/BV_{CBO} \cong 1/\eta \sqrt{h_{FE}} \tag{2}$$

Where $BV_{CBO}$ is the voltage breakdown between the base and collector and is equivalent to the avalanche voltage breakdown shown in FIG. 11 and $\eta\, h_{FE}$ is the current gain of a device. The factor $\eta$ is the root sign $\sqrt{\ }$ is a function of ionization characteristics for holes and electrons and differs for NPN and PNP devices. From theoretical considerations, equation (2) is difficult to solve. Thus, for practical purposes, the values for the equation (1) were empirically determined to be:

$$\text{For NPN } \frac{LV_{CEO}}{BV_{CEO}}\Big|_{h_{FE}=250} \cong 0.4 \tag{3}$$

$$\text{For PNP } \frac{LV_{CEO}}{BV_{CEO}}\Big|_{h_{FE}=50} \cong 0.8 \tag{4}$$

for range at substrate concentrations of interest.

Thus, the relationship for the NPN and PNP transistors was established by measurements. By these measurements, it was established that the ratio for the NPN transistor is approximately 0.4 and for the PNP transistor is approximately 0.8. When these curves are plotted against impurity concentration as shown in FIG. 12, then line A represents the requriement of breakdown voltage with some safety margin which is shown as being 60 volts. Thus, for this voltage, the maximum impurity concentration for the NPN device must be less than $2.5 \times 10^{15}$ atoms/cm$^3$ and for the PNP device must be less than $1 \times 10^{16}$ atoms/cm$^3$. Therefore, in order to have a concentration less than $2.5 \times 10^{15}$ atoms/cm$^3$ for the NPN device, it is not possible to utilize a P-type substrate with a concentration of $1 \times 10^{16}$. Thus, it can be seen that to obtain a voltage rating for PNP and NPN complementary devices which are compatible, it is necessary to utilize an N-type substrate to dope it with P-type impurities. The range B shown in FIG. 12 represents the range of the N-type starting material used in the actual fabrication of devices in accordance with the present invention.

It is apparent from the foregoing that there has been provided a greatly improved semiconductor structure which has complementary circuitry formed therein which can be fabricated by relatively simple and straightforward steps to provide devices having excellent characteristics.

I claim:

1. In a method for making complementary circuitry having compatible voltage ratings for deviced formed therein, utilizing a semiconductor body having a region of N conductivity type and having first and second spaced generally parallel surfaces, forming a deep diffused region of P conductivity type in said semiconductor body extending inwardly from said second surface to a depth ranging from 15 to 80 microns by diffusing a P-type impurity into said semiconductor body for a period of time ranging from 8 hours to 100 hours at a temperature ranging from 1,200° to 1,300° C to provide a P-N junction extending to said second surface, said step of forming the deep diffused region being performed prior to the formation of any other P-N junction in said semiconductor body, forming isolation moats in said body extending inwardly from said second surface so that said region of P conductivity tyoe is encompassed by one of said moats, forming a layer of insulating material on said second surface and in said moats, providing a support body on said layer of insulating material, and removing a portion of said semiconductor body on the side of said first surface until a new surface is provided through which the layer of insulating material in said moat extends and through which the regions of N and P conductivity sypes extend to provide an island of N-type semiconductor material and an island of P-typ semiconductor material which are dielectrically isolated from each other and from the support body.

2. A method as in claim 1 together with the step of fabricating complementary NPN and PNP devices with compatible voltage ratings in said islands of N and P conductivity types.

3. A method as in claim 1 together with the step of forming a heavily doped region of N conductivity type in said region of N conductivity type extending inwardly from said second surface and wherein the moats are positioned so that one of the moats encompasses the region of N conductivity type with the heavily doped region therein to provide an island with the heavily doped region at the bottom of the island and spaced below the new surface.

4. A method as in claim 1 wherein said island of N conductivity type serves as a first region of N conductivity type and wherein said island of P conductivity type serves as a second region of P conductivity type together with he steps in the order named of forming a third region of P conductivity type in said first region, forming a fourth region of N conductivity type in said second region, forming a fifth region of N conductivity type in said third region, forming a sixth region of P conductivity tpe in said fourth region, forming a layer of insulating material on said new surface over said islands and providing electrical contact elements on said last named layer of nsulating material and extending through said last named layer of insulating material for making contact to said first, third and fifth regions and to said second, fourth and sixth regions whereby the first, third and fifth regions serve as the collector, base and emitter of an NPN transistor and the second, fourth and sixth regions serve as the collector, base and emitter f a PNP transistor.

5. A method as in claim 1 wherein said island of N conductivity type serves as a first region of N conductivity type and wherein said island of P conductivity type serves as a second region of P conductivity type together with the steps in the order named of forming a third region of N conductivity type in said second region, forming a fourth region of P conductivity type in said first region, forming a fifth region of P conductivity type in said third region, forming a sixth region of N conductivity type in said fourth region, forming a layer of insulating material on sadi new surface over said island of N conductivity type and said island of P conductivity type and providing electrical contact elements on said last named layer of insulating material and extending through said last named layer of insulating material for making contact to said first, fourth and sixth regions and said second, third and fifth regions, whereby the first, fourth and sixth regions serve as a collector, base and emitter of the NPN transistor and the second, third and fifth regions serve as a collector, base and emitter of the PNP transistor.

6. In a method for making complementary NPN and PNP transistors having compatible voltage ratings in a semiconductor body having front and back surfaces and having N-type conductivity, fiffusing an impurity of P-type conductivity through the back surface of the semiconductor body to provide a deep diffused P-type region of P-type conductivity in said semiconductor body to a depth ranging from 15 to 80 microns by diffusing a P-type impurity into said semiconductor body for a periof of time ranging from 8 hours to 100 hours at a temperature ranging from 1,200° to 1,300° C to provide a P-N junction extending to said second surface, said step of forming the deep diffused region being performed prior to the formation of any other P-N junction in said semiconductor body, forming isolation moats in said semiconductor body extending inwardly from said back surface so that said P-type region is encompassed by one of said moats, forming a layer of insulating material on said back surface and extending into said moats, removing a portion of the semiconductor body from the front surface so that a new surface is provided through which said layer of insulating material extends and to expose the back side of said region of P-type conductivity and to expose an N-type region, fabricating an NPN transistor in said N-type region of said semiconductor body by introducing impurities through said new surface, and fabricating a PNP transistor of a complementary type in the P-type region of opposite conductivity by introducing impurities through said new surface to provide a PNP transistor complementary to the NPN transistor in the semiconductor body.

7. A method as in claim 6 wherein said P-type region has an impurity concentration which increases with depth from the new surface, together with the step of diffusing an N-type impurity into said semiconductor body through said back surface to provide a heavily doped N-type region which forms a buried layer for the NPN transistor.

8. A method as in claim 6 wherein the diffusion through the back surface is carried out to a depth of approximately 60 microns.

* * * * *